United States Patent
Lee et al.

(10) Patent No.: US 8,232,904 B2
(45) Date of Patent: Jul. 31, 2012

(54) FOLDING ANALOG-TO-DIGITAL CONVERTER

(75) Inventors: Jung-Ho Lee, Gunpo-si (KR); Jung-Eun Lee, Yongin-si (KR); Heung-Bae Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 140 days.

(21) Appl. No.: 12/784,781

(22) Filed: May 21, 2010

(65) Prior Publication Data

US 2011/0018751 A1    Jan. 27, 2011

(30) Foreign Application Priority Data

Jul. 21, 2009 (KR) .................. 10-2009-0066522

(51) Int. Cl.
*H03M 1/12* (2006.01)
(52) U.S. Cl. ........................ 341/155; 341/161
(58) Field of Classification Search .......... 341/155, 341/161, 156
See application file for complete search history.

(56) References Cited

U.S. PATENT DOCUMENTS

| | | | |
|---|---|---|---|
| 6,950,051 B2 * | 9/2005 | Lee et al. ............. | 341/161 |
| 7,088,281 B1 * | 8/2006 | Menkus ............. | 341/156 |
| 7,233,275 B2 * | 6/2007 | Aksin et al. ............. | 341/162 |
| 7,999,717 B2 * | 8/2011 | Ohkawa et al. ............. | 341/159 |

FOREIGN PATENT DOCUMENTS

| | | |
|---|---|---|
| JP | 2007-174288 A | 7/2007 |
| JP | 2008-61206 A | 3/2008 |
| KR | 10-0838402 B1 | 6/2008 |

* cited by examiner

*Primary Examiner* — Brian Young
(74) *Attorney, Agent, or Firm* — Sughrue Mion, PLLC (57) ABSTRACT

A folding analog-to-digital converter including: a reference voltage generator, a track-and-hold circuit and a first pre-amplification circuit. The reference voltage generator generates a plurality of reference voltages. The track-and-hold circuit generates a sampling control signal having a voltage level lower than or equal to a level of a power supply voltage by maintaining an initial level of a boost capacitor voltage at a level lower than a level of a power supply voltage, and samples and holds an input voltage signal in response to the generated sampling control signal to generate a sampled signal. The first pre-amplification circuit amplifies each of voltage differences between the sampled signal and each of the plurality of reference voltages.

19 Claims, 9 Drawing Sheets

FOLDING ANALOG-TO-DIGITAL CONVERTER

CROSS-REFERENCE TO RELATED APPLICATION

This application claims priority under 35 USC §119 from Korean Patent Application No. 10-2009-0066522, filed on Jul. 21, 2009 in the Korean Intellectual Property Office, the contents of which are herein incorporated by reference in their entirety.

BACKGROUND

1. Technical Field

Exemplary embodiments relate to an analog-to-digital converter, and more particularly to a folding analog-to-digital converter including a track-and-hold circuit.

2. Description of the Related Art

As communication technologies are developed, the operation speed and the resolution of analog-to-digital converters require improvement. Generally analog-to-digital converters may be categorized into flash analog-to-digital converters, folding analog-to-digital converters and pipeline analog-to-digital converters. The folding analog-to-digital converters are widely used in communication systems because of high resolution, low power consumption and small size.

Sample-and-hold circuits or track-and-hold circuits may be used in the folding analog-to-digital converters to sample and hold input signals, such as analog signals. Recently, bootstrapped track-and-hold circuits have been used for sampling the input signals that have high resolution.

However, in related art bootstrapped track-and-hold circuits, a level of a boosting voltage, which indicates a voltage at a boost node coupled to a boost capacitor, is higher than a level of a power supply voltage. Thus, additional protection circuits are required for protecting elements in the related art bootstrapped track-and-hold circuits and the structure of the related art bootstrapped track-and-hold circuits is complex as a result.

SUMMARY

Accordingly, the exemplary embodiments are provided to substantially obviate one or more problems due to limitations and disadvantages of the related art.

Some exemplary embodiments provide a folding analog-to-digital converter including a track-and-hold circuit that has a simple structure and an improved reliability.

According to an aspect of an exemplary embodiment, there is provided a folding analog-to-digital converter including a reference voltage generator, a track-and-hold circuit and a first pre-amplification circuit. The reference voltage generator generates a plurality of reference voltages. The track-and-hold circuit generates a sampling control signal having a voltage level lower than or equal to a level of a power supply voltage by maintaining an initial level of a boost capacitor voltage at a level lower than the level of the power supply voltage, receives an input voltage signal, and samples and holds the input voltage signal in response to the sampling control signal to generate a sampled signal. The boost capacitor voltage is a voltage charged across a boost capacitor included in the track-and-hold circuit. The first pre-amplification circuit amplifies each of voltage differences between the sampled signal and each of the plurality of reference voltages.

The track-and-hold circuit may include a bootstrapped clock generator and a track-and-hold unit.

The bootstrapped clock generator may generate the sampling control signal based on a clock signal. The track-and-hold unit may sample and hold the input voltage signal in response to the sampling control signal to generate the sampled signal.

A level of a boosting voltage may be lower than or equal to the level of the power supply voltage when the bootstrapped clock generator receives the input voltage signal. The boosting voltage may be a voltage at a boost node coupled to the boost capacitor.

The bootstrapped clock generator may include the boost capacitor, a first p-type metal oxide semiconductor (PMOS) transistor, a first switch, a second switch, a second PMOS transistor and a third switch.

The boost capacitor may be connected between a boost node and a first node. The first PMOS transistor may be connected between the power supply voltage and the boost node. A gate of the first PMOS transistor may receive a first clock signal. The first switch may selectively connect the input voltage signal to the first node in response to the first clock signal and a second clock signal. The second clock signal may be an inversion signal of the first clock signal. The second switch may selectively connect a reference voltage signal to the first node in response to the second clock signal. A level of the reference voltage signal may be lower than a maximum level of the input voltage signal. A second PMOS transistor may transfer a boosting voltage to a second node in response to the second clock signal and may generate the sampling control signal. The boosting voltage may be a voltage at the boost node. The third switch may reset the second node in response to the second clock signal.

The bootstrapped clock generator may further include a first input buffer and a second input buffer. The first input buffer may buffer the input voltage signal to provide the buffered input voltage signal to the first switch. The second input buffer may buffer the reference voltage signal to provide the buffered reference voltage signal to the second switch.

The track-and-hold unit may include an input buffer, a MOS transistor, a capacitor and an output buffer.

The input buffer may buffer the input voltage signal. The MOS transistor may transfer an output signal of the input buffer to a third node in response to the sampling control signal. The capacitor may be coupled to the third node. The output buffer may buffer a voltage of the third node to output the sampled signal.

The track-and-hold unit may include a first MOS transistor, a second MOS transistor, and a capacitor.

The first MOS transistor may transfer the input voltage signal to a third node in response to the sampling control signal. The second MOS transistor may be connected between the third node and a fourth node. A first electrode and a second electrode of the second MOS transistor may be electrically coupled to each other. A gate of the second MOS transistor may receive the clock signal. The capacitor may be coupled to the fourth node.

The track-and-hold unit may further include an input buffer and an output buffer. The input buffer may buffer the input voltage signal to provide the buffered input voltage signal to the first MOS transistor. The output buffer may buffer a voltage of the fourth node to output the sampled signal.

According to an aspect of another exemplary embodiment, there is provided a folding analog-to-digital converter including a reference voltage generator, a first track-and-hold circuit, a first pre-amplification circuit, a second track-and-hold circuit, a second pre-amplification circuit, a folding amplification circuit, a first comparison circuit, a second comparison circuit, a third comparison circuit and an encoder. The reference voltage generator generates a plurality of reference voltages. The first track-and-hold circuit receives an input voltage signal and samples and holds the input voltage signal in response to the sampling control signal to generate a sampled signal. A voltage level of the sampling control signal is lower than or equal to a level of a power supply voltage. The first pre-amplification circuit amplifies each of voltage differences between the sampled signal and each of the plurality of reference voltages. The second track-and-hold circuit samples output signals of the first pre-amplification circuit. The second pre-amplification circuit amplifies output signals of the second track-and-hold circuit. The folding amplification circuit amplifies output signals of the second pre-amplification circuit to generate a plurality of folding signals. The first comparison circuit performs precise comparing operations on the plurality of folding signals. The second comparison circuit performs approximate comparing operations on the output signals of the second pre-amplification circuit. The third comparison circuit compares output signals of the first comparison circuit with output signals of the second comparison circuit. The encoder generates a digital output signal corresponding to the input voltage signal based on output signals of the third comparison circuit.

The first track-and-hold circuit may generate the sampling control signal having a voltage level lower than or equal to the level of the power supply voltage by maintaining an initial level of a boost capacitor voltage at a level lower than the level of the power supply voltage. The boost capacitor voltage may be a voltage charged across a boost capacitor included in the first track-and-hold circuit.

The first track-and-hold circuit may include a bootstrapped clock generator and a track-and-hold unit.

The bootstrapped clock generator may generate the sampling control signal based on a clock signal. The track-and-hold unit may sample and hold the input voltage signal in response to the sampling control signal to generate the sampled signal.

The folding analog-to-digital converter may further include a first preset switch, a second preset switch, a third preset switch and a fourth preset switch.

The first preset switch may be coupled to output terminals of the first pre-amplification circuit. The second preset switch may be coupled to output terminals of the second pre-amplification circuit. The third preset switch may be coupled to output terminals of the folding amplification circuit. The fourth preset switch may be coupled to output terminals of the first comparison circuit. The first preset switch, the second preset switch, the third preset switch and the fourth preset switch may be sequentially turned off in response to a clock signal that has multiple phases.

The second track-and-hold circuit may include a first MOS transistor, a second MOS transistor, a third MOS transistor, a fourth MOS transistor, a first capacitor and a second capacitor.

The first MOS transistor may transfer one of the output signals of the first pre-amplification circuit to a first node in response to a first clock signal. The second MOS transistor may be connected between the first node and a second node. A first electrode and a second electrode of the second MOS transistor may be electrically coupled to each other. A gate of the second MOS transistor may receive a second clock signal. The second clock signal may be an inversion signal of the first clock signal. The third MOS transistor may transfer another one of the output signals of the first pre-amplification circuit to a third node in response to the first clock signal. The fourth MOS transistor may be connected between the third node and a fourth node. A first electrode and a second electrode of the fourth MOS transistor being electrically coupled to each other. A gate of the fourth MOS transistor may receive the second clock signal. A first capacitor may be coupled to the second node. A second capacitor may be coupled to the fourth node.

The folding amplification circuit may include a plurality of folding amplifiers. Each of the plurality of folding amplifiers may include a plurality of differential input stages, a plurality of MOS transistors and a reset transistor.

The plurality of differential input stages may include a plurality of MOS transistors and a current source. The plurality of MOS transistors may be coupled to output nodes of the plurality of differential input stages. The reset transistor may be reset output nodes of the folding amplifier.

According to an aspect of another exemplary embodiment, there is provided a track-and-hold circuit of a folding analog-to-digital converter, the track-and-hold circuit including: a bootstrapped clock generator which generates a sampling control signal based on a clock signal; and a track-and-hold unit which receives an input voltage signal, and which samples and holds the received input voltage signal in response to the generated sampling control signal to generate a sampled signal, wherein a voltage level of the generated sampling control signal is lower than or equal to a level of a power supply voltage.

Accordingly, in the folding analog-to-digital converter that includes the track-and-hold circuit according to an exemplary embodiment, the level of the boosting voltage, which indicates a voltage at the boost node coupled the boost capacitor, is lower than the level of the power supply voltage, and thus the track-and-hold circuit need not include the additional protection circuits, may have a simple structure, and may have an improved reliability.

In the track-and-hold circuit, the bootstrapped clock generator may include a replica input buffer such that configuration of the replica input buffer may be substantially the same as the configuration of the input buffer included in the track-and-hold unit. Therefore, a path for the input signals through the track-and-hold unit and a path for the boosting voltage through the bootstrapped clock generator may be separated, and thus, glitch noises may be reduced and settling time of the sampled signal may be decreased.

In addition, the folding analog-to-digital converter may include a plurality of preset switches such that each of preset switches is coupled to each of the amplification stages. The plurality of preset switches may be sequentially turned off in response to the clock signal CLK that has multiple phases. Thus, the settling times may be shorter than the related art folding analog-to-digital converter and the operation speed and the resolution of the folding analog-to-digital converter may be improved.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EXEMPLARY EMBODIMENTS

Various example embodiments will be described more fully with reference to the accompanying drawings, in which exemplary embodiments are shown. This inventive concept may, however, be embodied in many different forms and should not be construed as limited to the exemplary embodiments set forth herein. Rather, these exemplary embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, terminologies "track-and-hold circuit" and "sample-and-hold circuit" may have substantially similar meanings For example, a track-and-hold circuit or a sample-and-hold circuit may have substantially the same configurations and operations that samples and holds an input signal to generate the sampled signal.

Figure 1:
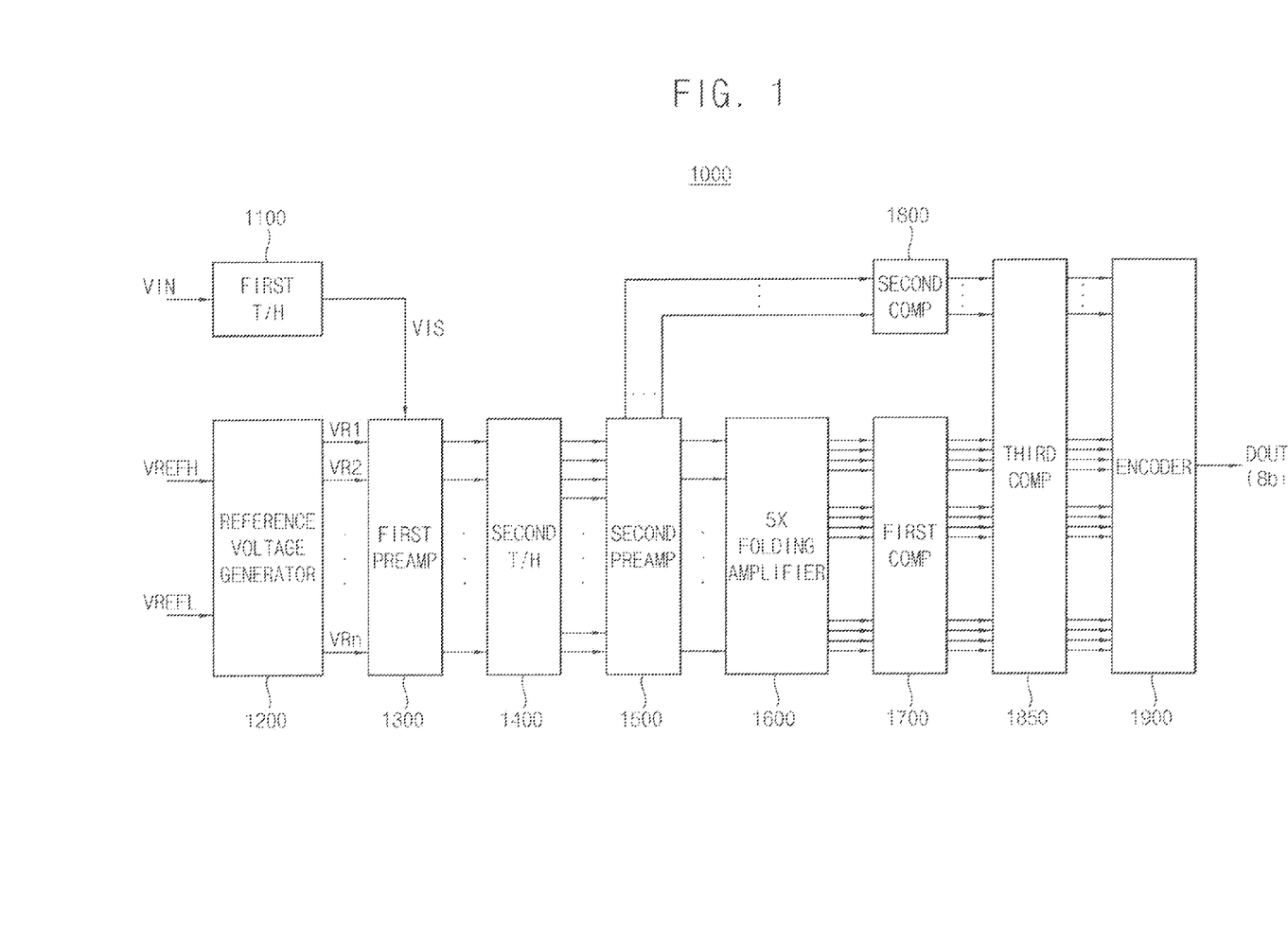
FIG. 1 is a block diagram illustrating a folding analog-to-digital converter according to an exemplary embodiment.

FIG. 1 is a block diagram illustrating a folding analog-to-digital converter 1000 according to an exemplary embodiment. Referring to FIG. 1, the folding analog-to-digital converter 1000 includes a first track-and-hold circuit 1100, a reference voltage generator 1200, a first pre-amplification circuit 1300, a second track-and-hold circuit 1400, a second pre-amplification circuit 1500, a folding amplification circuit 1600, a first comparison circuit 1700, a second comparison circuit 1800, a third comparison circuit 1850, and an encoder 1900.

The reference voltage generator 1200 generates a plurality of reference voltages VR1, VR2, . . . , VRn based on a first reference voltage VREFH and a second reference voltage VREFL. The first track-and-hold circuit 1100 receives an input voltage signal VIN, generates a sampling control signal, and samples and holds the input voltage signal VIN based on the generated sampling control signal to generate a sampled signal VIS. A level of the generated sampling control signal is lower than or equal to a level of a power supply voltage. The first pre-amplification circuit 1300 amplifies each of voltage differences between the sampled signal VIS and each of the plurality of reference voltages VR1 through VRn. The second track-and-hold circuit 1400 may be an intermediate track-and-hold circuit that samples output signals of the first pre-amplification circuit 1300. The second pre-amplification circuit 1500 amplifies output signals of the second track-and-hold circuit 1400.

The folding amplification circuit 1600 amplifies output signals of the second pre-amplification circuit 1500 to generate a plurality of folding signals. The first comparison circuit 1700 performs precise comparing operations on the plurality of folding signals. The second comparison circuit 1800 may be a coarse comparison circuit that performs approximate comparing operations on the output signals of the second pre-amplification circuit 1500. The third comparison circuit 1850 compares output signals of the first comparison circuit 1700 with output signals of the second comparison circuit 1800. The encoder 1900 generates a digital output signal DOUT corresponding to the input voltage signal VIN based on output signals of the third comparison circuit 1850. The number of bits of the digital output signal DOUT may be eight.

The first track-and-hold circuit 1100 maintains an initial level of a boost capacitor voltage, which indicates a voltage charged across a boost capacitor included in the first track-and-hold circuit 1100, at a level lower than the level of the power supply voltage. The first track-and-hold circuit 1100 may generate the sampling control circuit based on a clock signal. A voltage level of the generated sampling control signal is lower than or equal to the level of the power supply voltage.

Figure 2:
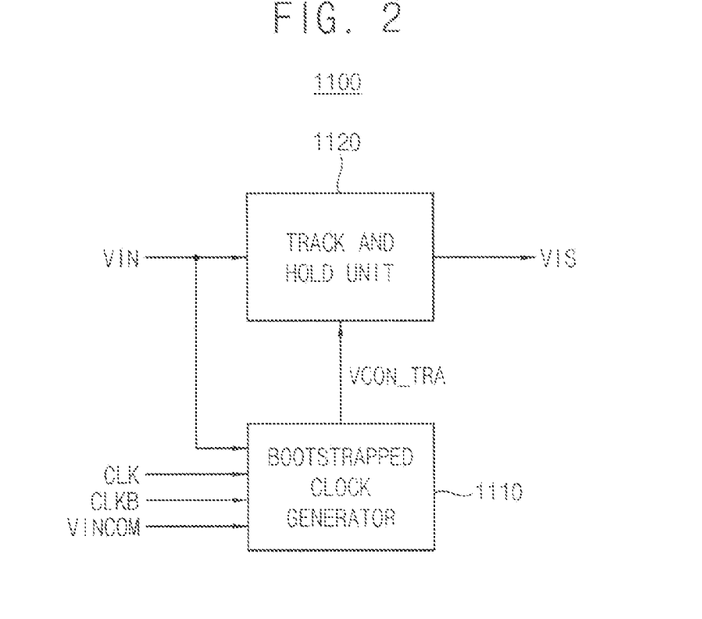
FIG. 2 is a block diagram illustrating a first track-and-hold circuit included in the folding analog-to-digital converter of FIG. 1.

FIG. 2 is a block diagram illustrating the first track-and-hold circuit 1100 included in the folding analog-to-digital converter 1000 of FIG. 1. Referring to FIG. 2, the first track-and-hold circuit 1100 may include a bootstrapped clock generator 1110 and a track-and-hold unit 1120.

The bootstrapped clock generator 1110 generates a sampling control signal VCON_TRA having a voltage level lower than or equal to a level of a power supply voltage by maintaining an initial level of a boost capacitor voltage at a level lower than the level of the power supply voltage. The boost capacitor voltage is a voltage charged across a boost capacitor included in the bootstrapped clock generator 1110. The initial level of the boost capacitor voltage indicates a level of the boost capacitor voltage when a logic level of a first clock signal CLK is maintained at a first logic level, such as a logic low level during a sufficient time and the boost capacitor is fully charged.

The bootstrapped clock generator 1110 generates the sampling control signal VCON_TRA based on the first clock signal CLK, a second clock signal CLKB, a reference voltage signal VINCOM, and the input voltage signal VIN. The second clock signal CLKB may be an inversion signal of the first clock signal CLK.

The track-and-hold unit 1120 samples and holds the input voltage signal VIN in response to the sampling control signal VCON_TRA to generate the sampled signal VIS.

In the first track-and-hold circuit 1100 of FIG. 2, the initial level of the boost capacitor voltage may be lower than the level of the power supply voltage. Thus, the first track-and-hold circuit 1100 may have a simple structure and an improved reliability.

Figure 3:
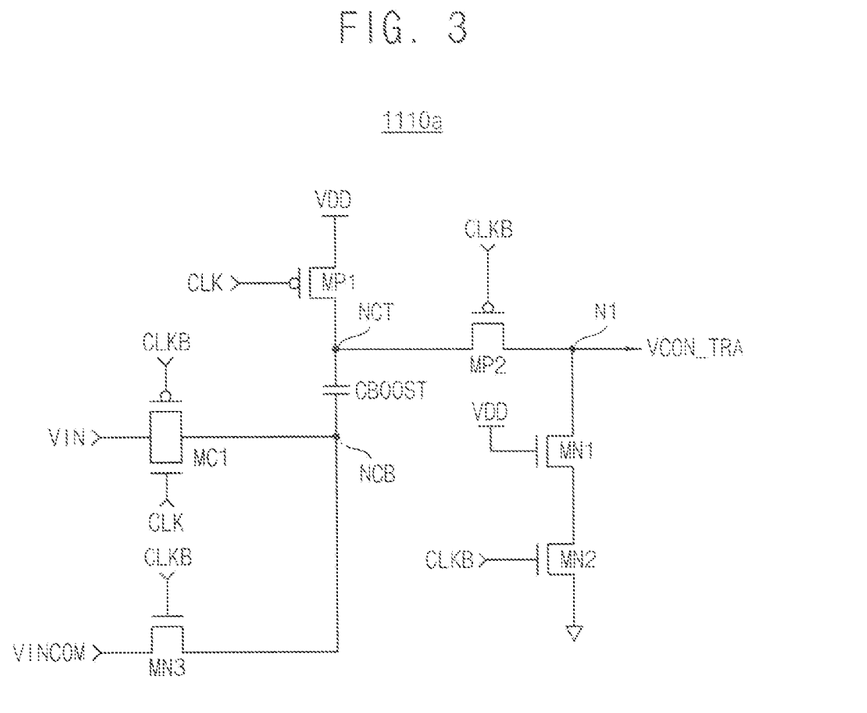
FIG. 3 is a circuit diagram illustrating an example of a bootstrapped clock generator included in the first track-and-hold circuit of FIG. 2.

FIG. 3 is a circuit diagram illustrating an example of a bootstrapped clock generator 1110a included in the first track-and-hold circuit 1100 of FIG. 2. Referring to FIG. 3, the bootstrapped clock generator 1110a may include a boost capacitor CBOOST, a complementary metal oxide semiconductor (CMOS) transistor MC1, a first p-type metal oxide semiconductor (PMOS) transistor MP1, a second PMOS transistor MP2, a first n-type metal oxide semiconductor (NMOS) transistor MN1, a second NMOS transistor MN2, and a third NMOS transistor MN3.

The boost capacitor CBOOST is connected between a boost node NCT and a first node NCB. The first PMOS transistor MP1 has a first electrode (for example, a source) coupled to the power supply voltage VDD, a second electrode (for example, a drain) coupled to the boost node NCT, and a gate which receives the first clock signal CLK. The CMOS transistor MC1 may be a first switch that selectively connects (or transmits) the input voltage signal VIN to the first node NCB in response to the first and second clock signals CLK and CLKB. The second clock signal CLKB may be an inversion signal of the first clock signal CLK. The third NMOS transistor MN3 may be a second switch that selectively connects the reference voltage signal VINCOM to the first node NCB in response to the second clock signal CLKB. A level of the reference voltage signal VINCOM may be lower than a maximum level of the input voltage signal VIN.

The second PMOS transistor MP2 transfers the boosting voltage, which indicates the voltage at the boost node NCT, to the second node N1 in response to the second clock signal CLKB to generate the sampling control signal VCON_TRA. The first NMOS transistor MN1 has a first electrode (for example, a drain) coupled to the second node N1, a gate which receives the power supply voltage VDD, and a second electrode (for example, a source). The second NMOS transistor MN2 has a first electrode (for example, a drain) coupled to the second electrode of the first NMOS transistor MN1, a second electrode (for example, a source) coupled to a ground voltage, and a gate which receives the second clock signal CLKB. The first and second transistors MN1 and MN2 may reset the second node N1 in response to the second clock signal CLKB and may operate as a third switch.

Hereinafter, an operation of the bootstrapped clock generator 1110a of FIG. 3 will be described.

When a logic level of the first clock signal CLK is a first logic level, such as the logic low level, the first PMOS transistor MP1 is turned on, and the power supply voltage VDD is transferred to the boost node NCT. Since a logic level of the second clock signal CLKB is a second logic level, such as a logic high level, the third NMOS transistor MN3 is turned on and the reference voltage signal VINCOM is transferred to the first node NCB. The level of the reference voltage signal VINCOM may be lower than the maximum level of the input voltage signal VIN, as described above. Thus, the initial level of the boost capacitor voltage is VDD−VINCOM, whereas an initial level of a boost capacitor voltage is the level of the power supply voltage VDD in a related art bootstrapped clock generator.

When the logic level of the first clock signal CLK transitions from the first logic level to a second logic level, the first PMOS transistor MP1 is turned off. The second logic level may be the logic high level. Since the logic level of the second clock signal CLKB is the first logic level, such as the logic low level, the third NMOS transistor MN3 is turned off, the CMOS transistor MC1 is turned on, and the input voltage signal VIN is transferred to the first node NCB. Thus, the level of the boosting voltage is VDD−VINCOM+VIN. For example, a maximum level of the boosting voltage may be about 1.4 V when the level of the power supply voltage VDD may be about 1.2 V, the level of the reference voltage signal VINCOM may be about 0.3V and the maximum level of the input voltage signal VIN may be about 0.5 V.

When the logic level of the first clock signal CLK is the second logic level, such as the logic high level, the second PMOS transistor MP2 is turned on and the second NMOS transistor MN2 is turned off. The boosting voltage is transferred to the second node N1 through the second PMOS transistor MP2. Furthermore, when the logic level of the first clock signal CLK is the second logic level, the boost node NCT may share charges with the other branches coupled to the second node N1 through the second transistor MP2. Thus, the maximum level of the boosting voltage may be lower than or equal to the level of the power supply voltage VDD e.g., about 1.2 V. In addition, The MOS transistors included in the bootstrapped clock generator 1110a and the track-and-hold unit 1120 may not be high-voltage MOS transistors, but regular MOS transistors.

In the related art bootstrapped clock generator, both the level of the boosting voltage and the voltage level of the sampling control signal VCON_TRA are higher than the level of the power supply voltage VDD. Thus, additional protection circuits are required for protecting transistors included in the related art bootstrapped clock generator. In addition, additional boosting circuits need to be included for providing voltage applied to the gate of the first PMOS transistor MP1 for stabilized switching operations. Thus, a structure of the related art bootstrapped clock generator is complex.

On the contrary, in the bootstrapped clock generator 1110a according to an exemplary embodiment, the maximum level of the boosting voltage may be lower than or equal to the level of the power supply voltage VDD. Therefore, the bootstrapped clock generator 1110*a* need not include the additional protection circuits and boosting circuits, and thus the bootstrapped clock generator 1110*a* may have a simple structure.

Figure 4:
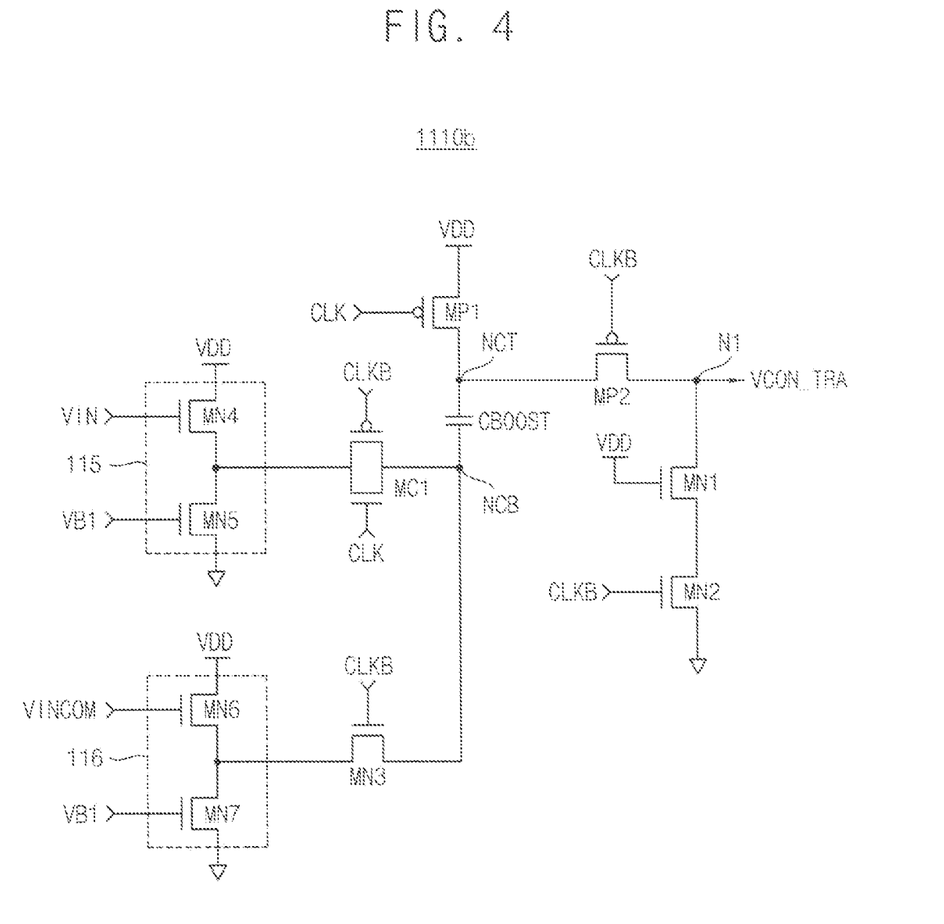
FIG. 4 is a circuit diagram illustrating another example of a bootstrapped clock generator included in the first track-and-hold circuit of FIG. 2.

FIG. 4 is a circuit diagram illustrating another example of a bootstrapped clock generator 1110*b* included in the first track-and-hold circuit 1100 of FIG. 2. Referring to FIG. 4, the bootstrapped clock generator 1110*b* may include a boost capacitor CBOOST, a CMOS transistor MC1, a first PMOS transistor MP1, a second PMOS transistor MP2, a first NMOS transistor MN1, a second NMOS transistor MN2, a third NMOS transistor MN3, a first input buffer 115, and a second input buffer 116.

The first input buffer 115 buffers the input voltage signal VIN and the second input buffer 116 buffers the reference voltage signal VINCOM. The level of the reference voltage signal VINCOM may be lower than the maximum level of the input voltage signal VIN. The boost capacitor CBOOST is connected between a boost node NCT and a first node NCB. The first PMOS transistor MP1 has a first electrode (for example, a source) coupled to the power supply voltage VDD, a second electrode (for example, a drain) coupled to the boost node NCT, and a gate which receives the first clock signal CLK. The CMOS transistor MC1 may be a first switch that selectively connects an output signal of the first input buffer 115 to the first node NCB in response to the first and second clock signals CLK and CLKB. The second clock signal CLKB may be an inversion signal of the first clock signal CLK. The third NMOS transistor MN3 may be a second switch that selectively connects an output signal of the second input buffer 116 to the first node NCB in response to the second clock signal CLKB.

The second PMOS transistor MP2 transfers the boosting voltage, which indicates the voltage at the boost node NCT, to the second node N1 in response to the second clock signal CLKB to generate the sampling control signal VCON_TRA. The first NMOS transistor MN1 has a first electrode (for example, a drain) coupled to the second node N1, a gate which receives the power supply voltage VDD, and a second electrode (for example, a source). The second NMOS transistor MN2 has a first electrode (for example, a drain) coupled to the second electrode of the first NMOS transistor MN1, a second electrode (for example, a source) coupled to the ground voltage, and a gate which receives the second clock signal CLKB. The first and second transistors MN1 and MN2 may reset the second node N1 in response to the second clock signal CLKB and may operate as a third switch.

The first input buffer 115 may include a fourth NMOS transistor MN4 and a fifth NMOS transistor MN5. The fourth NMOS transistor MN4 has a first electrode (for example, a drain) coupled to the power supply voltage VDD, a second electrode (for example, a source) coupled to a first electrode of the CMOS transistor MC1, and a gate which receives the input voltage signal VIN. The fifth NMOS transistor MN5 has a first electrode (for example, a drain) coupled to the second electrode of the fourth NMOS transistor MN4, a second electrode (for example, a source) coupled to the ground voltage, and a gate which receives a first bias voltage VB1.

The second input buffer 116 may include a sixth NMOS transistor MN6 and a seventh NMOS transistor MN7. The sixth NMOS transistor MN6 has a first electrode (for example, a drain) coupled to the power supply voltage VDD, a second electrode (for example, a source) coupled to a first electrode (for example, a drain) of the third NMOS transistor MN3, and a gate which receives the reference voltage signal VINCOM. The seventh NMOS transistor MN7 has a first electrode (for example, a drain) coupled to the second electrode of the sixth NMOS transistor MN6, a second electrode (for example, a source) coupled to the ground voltage, and a gate which receives the first bias voltage VB1.

Hereinafter, an operation of the bootstrapped clock generator 1110*b* of FIG. 4 will be described. Compared with the bootstrapped clock generator 1110*a* of FIG. 3, the bootstrapped clock generator 1110*b* of FIG. 4 further includes the first and second input buffers 115 and 116. Thus, differences between the operation of the bootstrapped clock generator 1110*a* of FIG. 3 and the operation of the bootstrapped clock generator 1110*b* of FIG. 4 will be described.

The first and second input buffers 115 and 116 may be replica input buffers such that configurations of the input buffers 115 and 116 may be substantially similar to an input buffer included in the track-and-hold unit 1120. The first input buffer 115 buffers the input voltage signal VIN and provides the buffered input voltage signal to the first node NCB. The second input buffer 116 buffers the reference voltage signal VINCOM and provides the buffered reference voltage signal to the first node NCB. Therefore, a path for the input signals through the track-and-hold unit 1120 and a path for the boosting voltage through the bootstrapped clock generator 1110*b* may be separated. Thus, in the first track-and-hold circuit 1100, glitch noises may be reduced and a settling time of the sampled signal VIS may be decreased.

Figure 5:
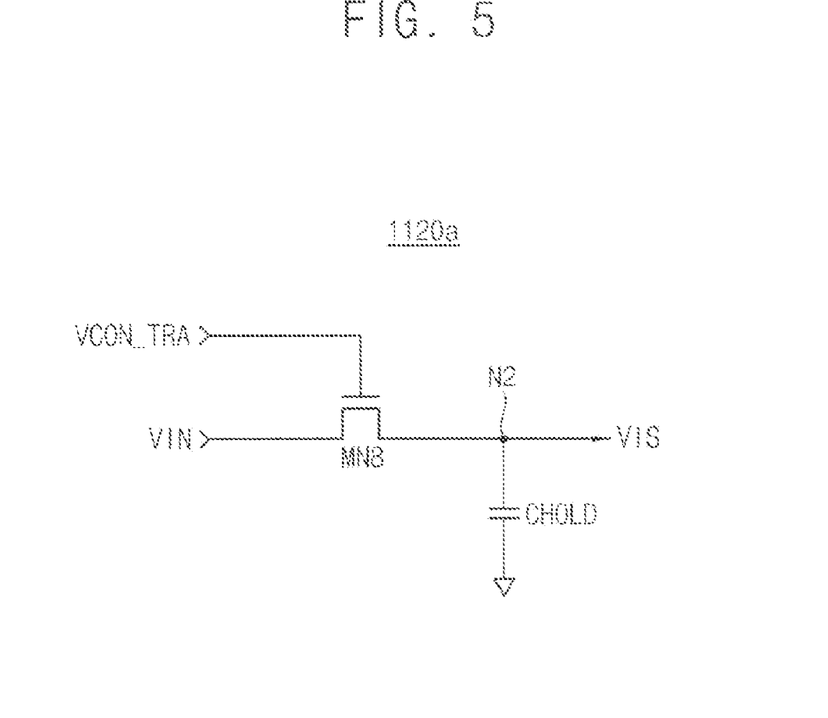
FIG. 5 is a circuit diagram illustrating an example of a track-and-hold unit included in the first track-and-hold circuit of FIG. 2.

FIG. 5 is a circuit diagram illustrating an example of a track-and-hold unit 1120*a* included in the first track-and-hold circuit 1100 of FIG. 2. Referring to FIG. 5, the track-and-hold unit 1120*a* may include an eighth NMOS transistor MN8 and a capacitor CHOLD.

The eighth NMOS transistor MN8 transfers the input voltage signal VIN to a third node N2 in response to the sampling control signal VCON_TRA. The capacitor CHOLD is connected between the third node N2 and the ground voltage. The sampled signal VIS is output from the third node N2.

When a logic level of the sampling control signal VCON_TRA is the second logic level, such as the logic high level, the eighth NMOS transistor MN8 is turned on and the input voltage signal VIN is transferred to the third node N2. The capacitor CHOLD may maintain or hold the voltage at the third node N2, that is, the sampled signal VIS. When the logic level of the sampling control signal VCON_TRA is the first logic level, such as the logic low level, the eighth NMOS transistor MN8 is turned off and the input voltage signal VIN is not transferred to the third node N2.

Figure 6:
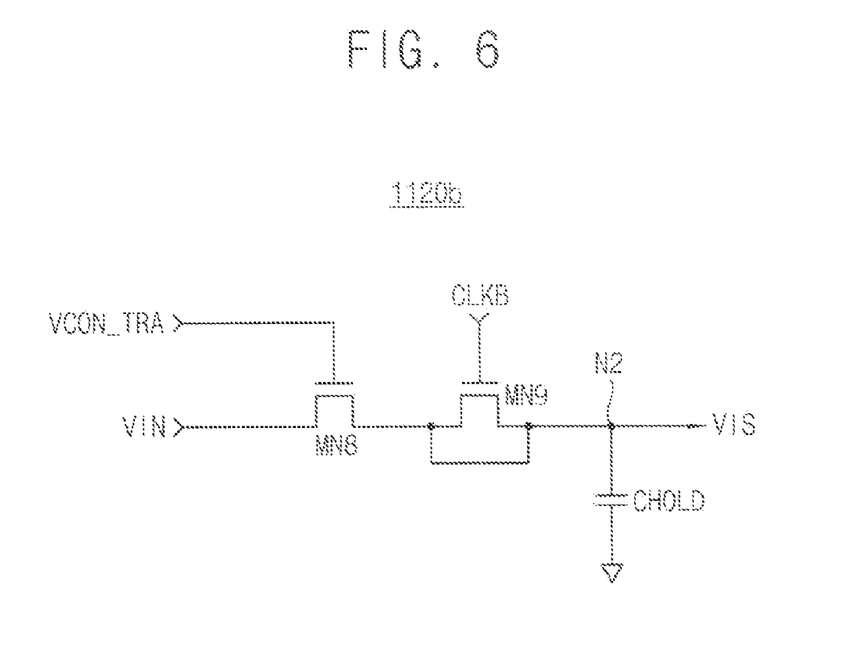
FIG. 6 is a circuit diagram illustrating another example of a track-and-hold unit included in the first track-and-hold circuit of FIG. 2.

FIG. 6 is a circuit diagram illustrating another example of a track-and-hold unit 1120*b* included in the first track-and-hold circuit 1100 of FIG. 2. Referring to FIG. 6, the track-and-hold unit 1120*b* may include an eighth NMOS transistor MN8, a ninth NMOS transistor MN9, and a capacitor CHOLD.

The eighth NMOS transistor MN8 transfers the input voltage signal VIN to a first electrode (for example, a drain) of the ninth NMOS transistor MN9 in response to the sampling control signal VCON_TRA. The ninth NMOS transistor MN9 is connected between a second electrode (for example, a source) of the eighth NMOS transistor MN8 and a third node N2. The first electrode and a second electrode (for example, a source) of the ninth NMOS transistor MN9 are electrically coupled to each other. A gate of the ninth NMOS transistor MN9 receives the second clock signal CLKB. The capacitor CHOLD is connected between the third node N2 and the ground voltage. The sampled signal VIS is output from the third node N2.

Hereinafter, an operation of the track-and-hold unit 1120*b* of FIG. 6 will be described. The sampling control signal VCON_TRA is enabled when the logic level of the second clock signal CLKB is the first logic level, such as the logic low level. When the sampling control signal VCON_TRA is enabled, for example, when the logic level of the sampling control signal VCON_TRA transitions to the second logic level, such as the logic high level, the eighth NMOS transistor MN8 is turned on and the input voltage signal VIN is transferred to the first electrode of the ninth NMOS transistor MN9. Thus, the input voltage signal VIN is transferred to the third node N2 through a connection line between the first and second electrodes of the ninth NMOS transistor MN9. The capacitor CHOLD may maintain or hold the voltage at the third node N2, that is, the sampled signal VIS.

The ninth NMOS transistor MN9 may be a dummy switch such that the first and second electrodes of the ninth NMOS transistor MN9 are electrically coupled to each other. When the sampled signal VIS is generated in response to the sampling control signal VCON_TRA, the track-and-hold unit 1120b may effectively generate the sampled signal VIS by including the dummy switch. Particularly, fluctuations of the sampled signal VIS caused by charge injection error may be reduced.

The ninth NMOS transistor MN9 may have a size for canceling the fluctuations of the sampled signal VIS caused by charge injection error. For example, the size of the ninth NMOS transistor MN9 may be about half of a size of the eighth NMOS transistor MN8.

Figure 7:
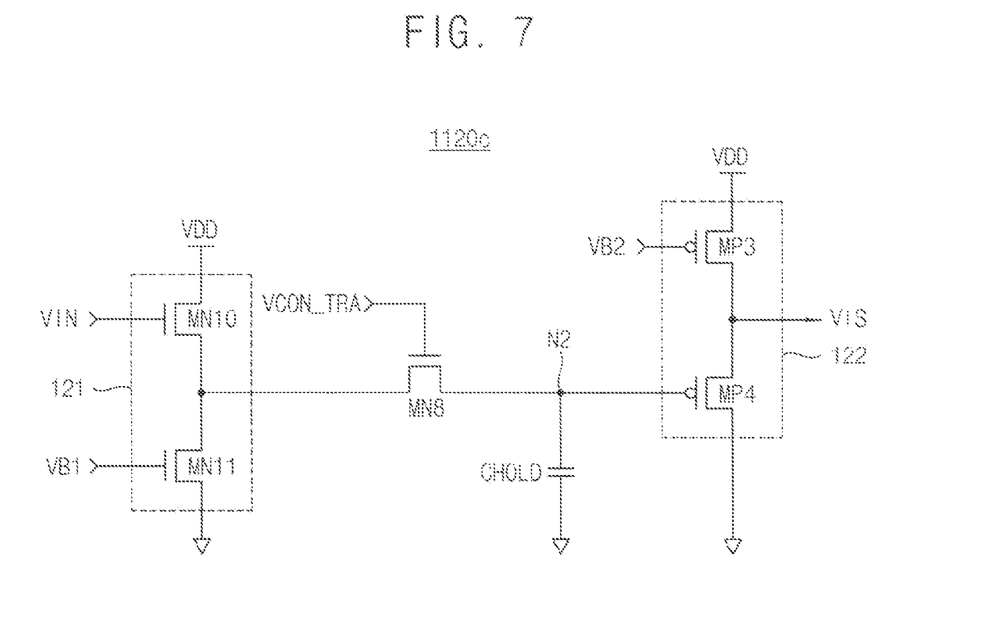
FIG. 7 is a circuit diagram illustrating still another example of a track-and-hold unit included in the first track-and-hold circuit of FIG. 2.

FIG. 7 is a circuit diagram illustrating still another example of a track-and-hold unit 1120c included in the first track-and-hold circuit 1100 of FIG. 2. Referring to FIG. 7, the track-and-hold unit 1120c may include a third input buffer 121, an eighth NMOS transistor MN8, a capacitor CHOLD, and a first output buffer 122.

The third input buffer 121 buffers the input voltage signal VIN. The eighth NMOS transistor MN8 transfers an output signal of the third input buffer 121 to a third node N2 in response to the sampling control signal VCON_TRA. The capacitor CHOLD is connected between the third node N2 and the ground voltage. The first output buffer 122 buffers the voltage signal at the third node N2 to output the sampled signal VIS.

The third input buffer 121 may include a tenth NMOS transistor MN10 and an eleventh NMOS transistor MN11. The tenth NMOS transistor MN10 has a first electrode (for example, a drain) coupled to the power supply voltage VDD, a second electrode (for example, a source) coupled to the first electrode of the eighth NMOS transistor MN8, and a gate which receives the input voltage signal VIN. The eleventh NMOS transistor MN11 has a first electrode (for example, a drain) coupled to the second electrode of the tenth NMOS transistor MN10, a second electrode (for example, a source) coupled to the ground voltage, and a gate which receives the first bias voltage VB1.

The first output buffer 122 may include a third PMOS transistor MP3 and a fourth PMOS transistor MP4. The third PMOS transistor MP3 has a first electrode (for example, a source) coupled to the power supply voltage VDD, a second electrode (for example, a drain) which outputs the sampled signal VIS, and a gate which receives a second bias voltage VB2. The fourth PMOS transistor MP4 has a first electrode (for example, a source) coupled to the second electrode of the third PMOS transistor MP3, a second electrode (for example, a drain) coupled to the ground voltage, and a gate coupled to the third node N2.

The track-and-hold unit 1120c may include the third input buffer 121 which constantly maintains an input impedance of the track-and-hold unit 1120c and may include the first output buffer 122 which constantly maintains an output impedance of the track-and-hold unit 1120c. The third input buffer 121 may be implemented with a source follower that includes the NMOS transistors MN10 and MN11. A configuration of the third input buffer 121 may be substantially similar to the configuration of the first and second input buffers 115 and 116 included in the bootstrapped clock generator 1110b of FIG. 4. The first output buffer 122 may be implemented with the source follower that includes the PMOS transistors MP3 and MP4.

Figure 8:
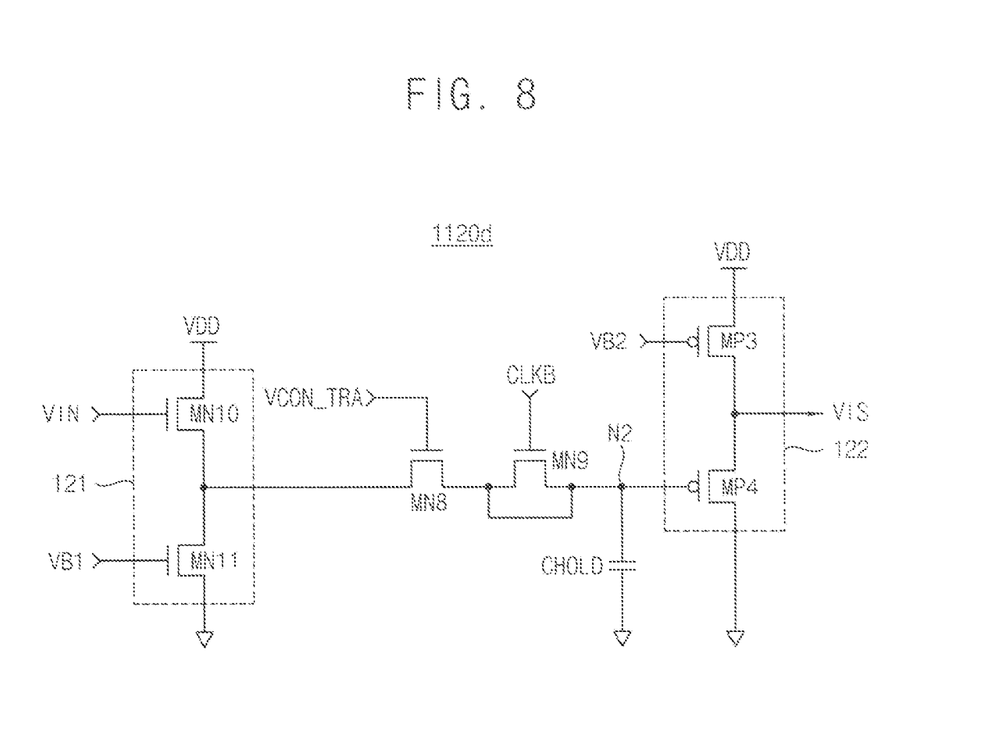
FIG. 8 is a circuit diagram illustrating still another example of a track-and-hold unit included in the first track-and-hold circuit of FIG. 2.

FIG. 8 is a circuit diagram illustrating still another example of a track-and-hold unit 1120d included in the first track-and-hold circuit 1100 of FIG. 2. Referring to FIG. 8, the track-and-hold unit 1120d may include a third input buffer 121, an eighth NMOS transistor MN8, a ninth NMOS transistor MN9, a capacitor CHOLD, and a first output buffer 122.

The third input buffer 121 buffers the input voltage signal VIN. The eighth NMOS transistor MN8 transfers an output signal of the third input buffer 121 to a first electrode (for example, a drain) of the ninth NMOS transistor MN9 in response to the sampling control signal VCON_TRA. The ninth NMOS transistor MN9 is connected between a second electrode (for example, a source) of the eighth NMOS transistor MN8 and a third node N2. The first electrode and a second electrode (for example, a source) of the ninth NMOS transistor MN9 are electrically coupled to each other. A gate of the ninth NMOS transistor MN9 is coupled to the second clock signal CLKB. The capacitor CHOLD is connected between the third node N2 and the ground voltage. The first output buffer 122 buffers the voltage signal at the third node N2 to output the sampled signal VIS.

Compared with the track-and-hold unit 1120c of FIG. 7, the track-and-hold unit 1120d of FIG. 8 further includes the ninth NMOS transistor MN9 operating as the dummy switch. As described above, when the sampled signal VIS is provided in response to the sampling control signal VCON_TRA, the track-and-hold unit 1120b may effectively generate the sampled signal VIS by including the dummy switch. Particularly, the fluctuations of the sampled signal VIS caused by charge injection error may be reduced.

As described above, in the first track-and-hold circuit 1100 according to an exemplary embodiment, the maximum level of the boosting voltage may be lower than or equal to the level of the power supply voltage VDD. Therefore, the first track-and-hold circuit 1100 need not include the additional protection circuits and boosting circuits of the related art circuit, and thus the first track-and-hold circuit 1100 may have a simple structure and an improved reliability. In addition, the bootstrapped clock generator 1110 may include a replica input buffer such that configuration of the replica input buffer may be substantially similar to the configuration of the input buffer included in the track-and-hold unit 1120. Therefore, a path for the input signals through the track-and-hold unit 1120 and a path for the boosting voltage through the bootstrapped clock generator 1110 may be separated, and thus, glitch noises may be reduced and settling time of the sampled signal may be decreased.

Figure 9:
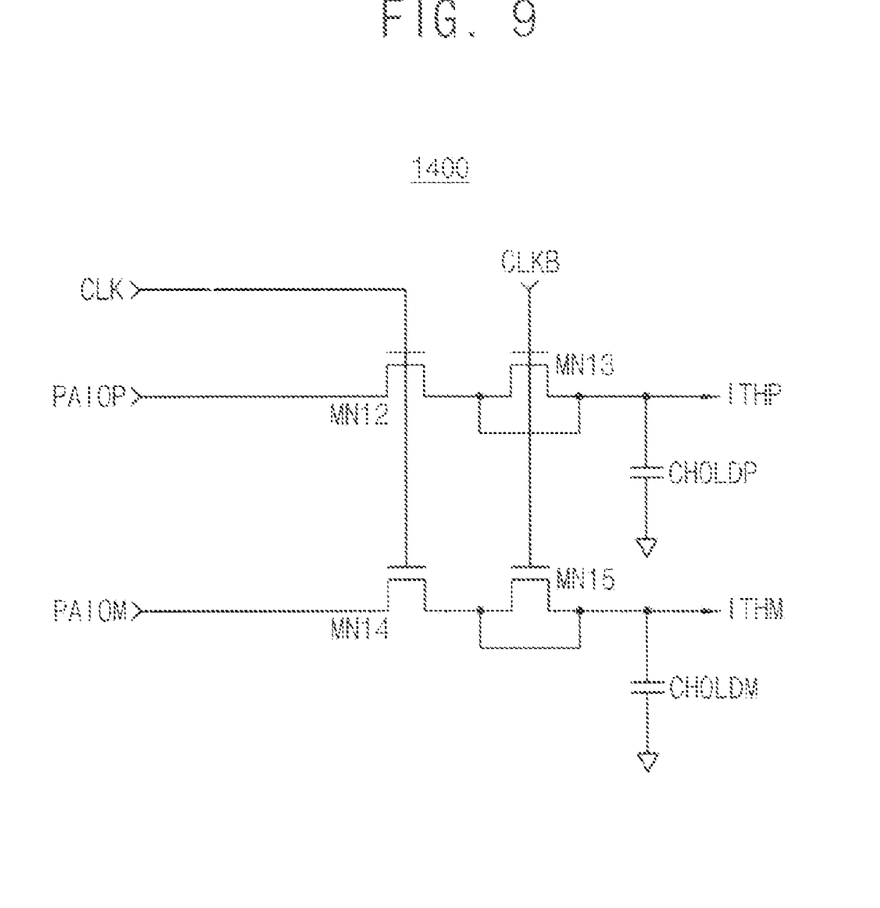
FIG. 9 is a circuit diagram illustrating an example of a second track-and-hold circuit included in the folding analog-to-digital converter of FIG. 1.

FIG. 9 is a circuit diagram illustrating an example of a second track-and-hold circuit 1400 included in the folding analog-to-digital converter 1000 of FIG. 1. Referring to FIG. 9, the second track-and-hold circuit 1400 may include a twelfth NMOS transistor MN12, a thirteenth NMOS transistor MN13, a fourteenth NMOS transistor MN14, a fifteenth NMOS transistor MN15, a first capacitor CHOLDP, and a second capacitor CHOLDM. The second track-and-hold circuit 1400 receives a first differential signal pair PAIOP and PAIOM from the first pre-amplification circuit 1300, samples the first differential signal pair PAIOP and PAIOM, and outputs a second differential signal pair ITHP and ITHM.

The twelfth NMOS transistor MN12 transfers one of the first differential signal pair (e.g., PAIOP) to the thirteenth NMOS transistor MN13 in response to the first clock signal CLK. A first electrode (for example, a drain) of the thirteenth NMOS transistor MN13 is coupled to a second electrode (for example, a source) of the twelfth NMOS transistor MN12. The first electrode and a second electrode (for example, a source) of the thirteenth NMOS transistor MN13 are electrically coupled to each other. A gate of the thirteenth NMOS transistor MN13 receives the second clock signal CLKB. The first capacitor CHOLDP is coupled to the second electrode of the thirteenth NMOS transistor MN13.

The fourteenth NMOS transistor MN14 transfers the other of the first differential signal pair (e.g., PAIOM) to the fifteenth NMOS transistor MN15 in response to the first clock signal CLK. A first electrode (for example, a drain) of the fifteenth NMOS transistor MN15 is coupled to a second electrode (for example, a source) of the fourteenth NMOS transistor MN14. The first electrode and a second electrode (for example, a source) of the fifteenth NMOS transistor MN15 are electrically coupled to each other. A gate of the fifteenth NMOS transistor MN15 receives the second clock signal CLKB. The second capacitor CHOLDM is coupled to the second electrode of the fifteenth NMOS transistor MN15.

When the logic level of the first clock signal CLK is the second logic level, such as the logic high level, the twelfth and fourteenth NMOS transistors MN12 and MN14 are turned on. One of the first differential signal pair (e.g., PAIOP) may be transferred through the twelfth NMOS transistor MN12 and through a connection line between the first and second electrodes of the thirteenth NMOS transistor MN13. The other of the first differential signal pair (e.g., PAIOM) may be transferred through the fourteenth NMOS transistor MN14 through a connection line between the first and second electrodes of the fifteenth NMOS transistor MN15. Thus, the second track-and-hold circuit 1400 outputs the second differential signal pair ITHP and ITHM to the second pre-amplification circuit 1500 of FIG. 1. The first and second capacitors CHOLDP and CHOLDM may maintain or hold voltage levels of the second differential signal pair ITHP and ITHM, respectively.

The thirteenth NMOS transistor MN13 may be the dummy switch such that the first and second electrodes of the thirteenth NMOS transistor MN13 are electrically coupled to each other. The fifteenth NMOS transistor MN15 may also be the dummy switch such that the first and second electrodes of the fifteenth NMOS transistor MN15 are electrically coupled to each other. As described above, the track-and-hold circuit 1400 may effectively generate the second differential signal pair ITHP and ITHM by including the dummy switches. Particularly, fluctuations of the second differential signal pair ITHP and ITHM caused by charge injection error may be reduced.

Figure 10:
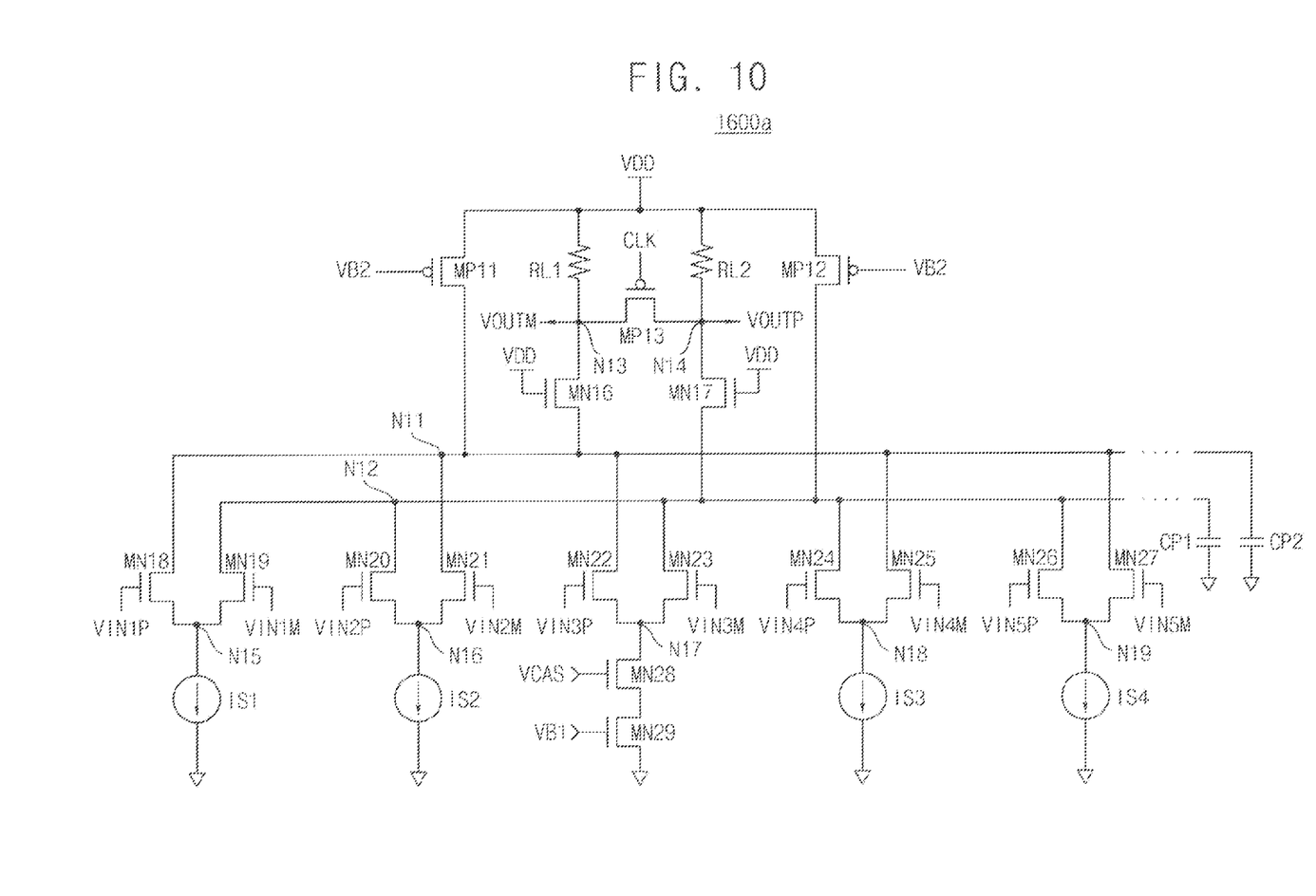
FIG. 10 is a circuit diagram illustrating an example of a folding amplifier included in the folding amplification circuit of the folding analog-to-digital converter of FIG. 1.

FIG. 10 is a circuit diagram illustrating an example of a folding amplifier 1600a included in the folding amplification circuit 1600 of the folding analog-to-digital converter 1000 of FIG. 1. The folding amplification circuit 1600 may include a plurality of folding amplifiers.

The folding amplifier 1600a may include a plurality of differential input stages. For example, a folding factor of the folding amplifier 1600a may be about 5. Although FIG. 10 illustrates the folding amplifier 1600a including five differential input stages, the number of differential input stages is not limited thereto in another exemplary embodiment.

Referring to FIG. 10, the folding amplifier 1600a includes a first differential input stage, a second differential input stage, a third differential input stage, a fourth differential input stage, and a fifth differential input stage. Each of differential input stages may include a plurality of NMOS transistors and a current source. For example, the first differential input stage includes NMOS transistors MN18 and MN19 and a first current source IS1. The second differential input stage includes NMOS transistors MN20 and Mn21 and a second current source IS2. The third differential input stage includes NMOS transistors MN22 and MN23 and a third current source. The third current source may include NMOS transistors MN28 and MN29. The fourth differential input stage includes NMOS transistors MN24 and MN25 and a fourth current source IS3. The fifth differential input stage includes NMOS transistors MN26 and MN27 and a fifth current source IS4.

The folding amplifier 1600a includes a first cascode transistor MN16, a second cascode transistor MN17, a first load resistor RL1, and a second load resistor RL2. The first cascode transistor MN16 has a first electrode (for example, a drain) coupled to the first load resistor RL1, a second electrode (for example, a source) coupled to the first output node N11 of the differential input stages, and a gate which receives the power supply voltage VDD. The second cascode transistor MN17 has a first electrode (for example, a drain) coupled to the second load resistor RL2, a second electrode (for example, a source) coupled to the second output node N12 of the differential input stages, and a gate which receives the power supply voltage VDD. The folding amplifier 1600a includes a reset PMOS transistor MP13 which resets output nodes N13 and N14. The folding amplifier 1600a includes PMOS transistors MP11 and MP12 which reduce influences of parasitic capacitors. The PMOS transistors MP11 and MP12 are coupled to the output nodes N11 and N12 of the differential input stages, respectively. The capacitors CP1 and CP2 may indicate the parasitic capacitors that are included in a wafer of a semiconductor device.

FIGS. 11A through 11D are diagrams illustrating sequential settling operations of amplification circuits included in the folding analog-to-digital converter 1000 of FIG. 1.

Figure 11A:
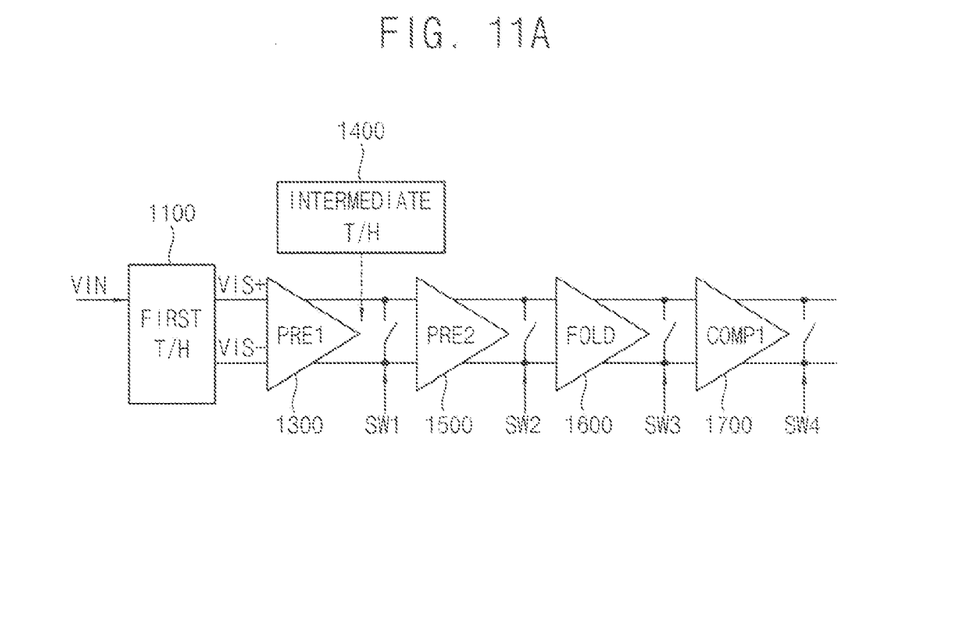
FIGS. 11A through 11D are diagrams illustrating sequential settling operations of amplification circuits included in the folding analog-to-digital converter of FIG. 1.

FIG. 11A is a block diagram illustrating some parts of the folding analog-to-digital converter 1000 of FIG. 1. Referring to FIG. 11A, a first switch SW1 is coupled to first output terminals of the first pre-amplification circuit 1300. A second switch SW2 is coupled to second output terminals of the second pre-amplification circuit 1500. A third switch SW3 is coupled to third output terminals of the folding amplification circuit 1600. A fourth switch SW4 is coupled to fourth output terminals of the first comparison circuit 1700. Each of the switches SW1, SW2, SW3 and SW4 may be a preset switch or an equalizing switch that resets each of the output terminals while each of output signals of the first pre-amplification circuit 1300, the second pre-amplification circuit 1500, the folding amplification circuit 1600 and the first comparison circuit 1700 is not provided to each of the output terminals. For example, the first switch SW1 may reset the first output terminals of the first pre-amplification circuit 1300 while the output signal of the first pre-amplification circuit 1300 is not provided to the first output terminals. The second track-and-hold circuit 1400 may be an intermediate track-and-hold circuit between the first pre-amplification circuit 1300 and the second pre-amplification circuit 1500.

Figure 11B:
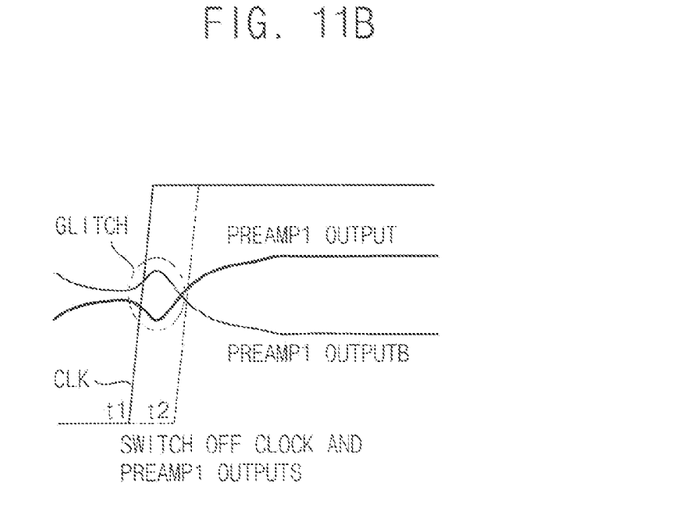

FIG. 11B illustrates waveforms of the output signals of the first pre-amplification circuit 1300 at the first output terminals of the first pre-amplification circuit 1300. Referring to FIG. 11B, at time t1, the first switch SW1 coupled to the first output terminals is turned off in response to a clock signal. The first pre-amplification circuit 1300 receives the sampled signals VIS+ and VIS− and amplifies the sampled signals VIS+ and VIS− to output the amplified signals. As illustrated in FIG. 11B, the output signals of the first pre-amplification circuit 1300 may have glitch noises. The glitch noises may be continued until about time t2.

Figure 11C:
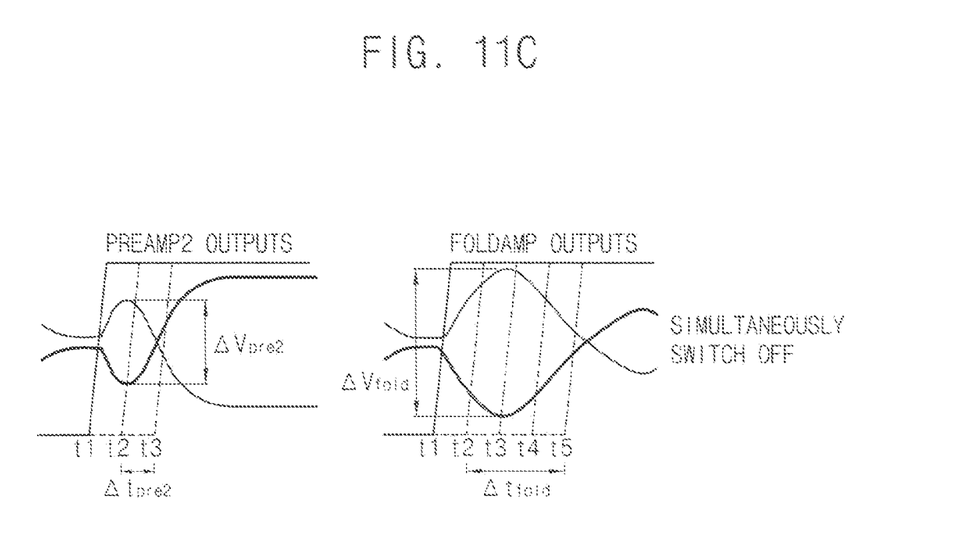
Figure 11D:
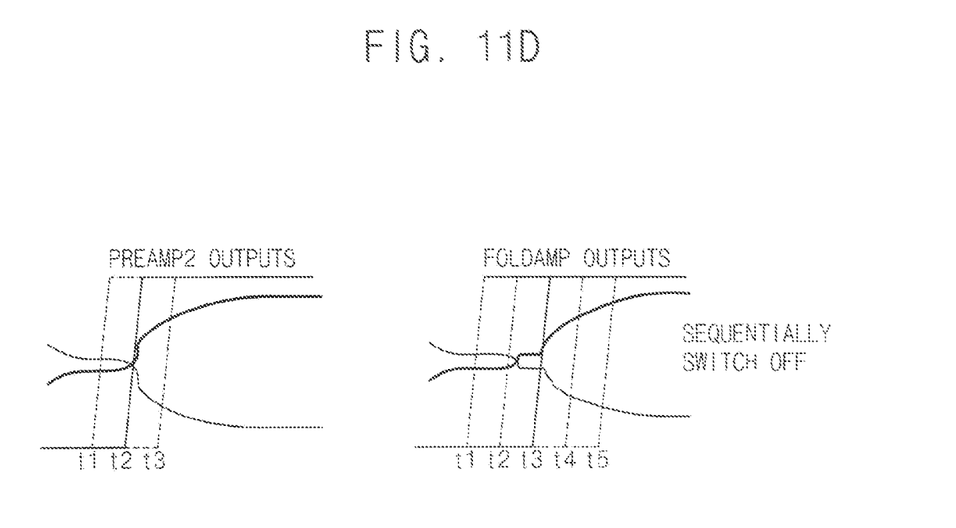

FIG. 11C illustrates waveforms of output signals of a second pre-amplification circuit at second output terminals and waveforms of output signals of a folding amplification circuit at third output terminals in a related art folding analog-to-digital converter. FIG. 11D illustrates waveforms of the output signals of the second pre-amplification circuit 1500 at the second output terminals and waveforms of the output signals of the folding amplification circuit 1600 at the third output terminals in the folding analog-to-digital converter 1000 according to an exemplary embodiment.

In the related art folding analog-to-digital converter, the second and third switches SW2 and SW3 are simultaneously turned off at time t1 in response to the clock signal that has a single phase. Thus, the glitch noises may be amplified at the second output terminals and the third output terminals, as illustrated in FIG. 11C. For example, at the second output terminals, a magnitude of the glitch noises may be increased to about ΔVpre2 and a duration time of the glitch noise may be increased by about Δtpre2. At the third output terminals, the magnitude of the glitch noises may be increased to about ΔVfold and a duration time of the glitch noise may be increased by about Δtfold. Thus, the settling times of the second and folding amplification circuits may be longer than the first pre-amplification circuit.

On the contrary, in the folding analog-to-digital converter 1000 according to an exemplary embodiment, the second and third switches SW2 and SW3 are sequentially turned off in response to the first clock signal CLK that has multiple phases. For example, the second switch SW2 may be turned off at time t2 and the third switch SW3 may be turned off at time t3. Thus, the settling times of the second and folding amplification circuits 1500 and 1600 may be shorter than the related art folding analog-to-digital converter and the operation speed and the resolution of the folding analog-to-digital converter 1000 may be improved.

As described above, the folding analog-to-digital converter according to exemplary embodiments may be used in communication systems that require high speed operation, high reliability and a simple structure.

While the exemplary embodiments and their advantages have been described in detail, it should be understood that various changes, substitutions and alterations may be made herein without departing from the scope of the inventive concept.

What is claimed is:

1. A folding analog-to-digital converter comprising:
a reference voltage generator which generates a plurality of reference voltages;
a track-and-hold circuit which generates a sampling control signal having a voltage level lower than or equal to a level of a power supply voltage by maintaining an initial level of a boost capacitor voltage at a level lower than the level of the power supply voltage, which receives an input voltage signal, and which samples and holds the received input voltage signal in response to the generated sampling control signal to generate a sampled signal, the track-and-hold circuit comprising a boost capacitor, and the boost capacitor voltage being a voltage charged across the boost capacitor; and
a first pre-amplification circuit which amplifies each of voltage differences between the generated sampled signal and each of the generated plurality of reference voltages.

2. The folding analog-to-digital converter of claim 1, wherein the track-and-hold circuit further comprises:
a bootstrapped clock generator which generates the sampling control signal based on a clock signal; and
a track-and-hold unit which samples and holds the received input voltage signal in response to the generated sampling control signal to generate the sampled signal.

3. The folding analog-to-digital converter of claim 2, wherein a level of a boosting voltage is lower than or equal to the level of the power supply voltage when the bootstrapped clock generator receives the input voltage signal, the boosting voltage being a voltage at a boost node coupled to the boost capacitor.

4. The folding analog-to-digital converter of claim 2, wherein the bootstrapped clock generator comprises:
the boost capacitor connected between a boost node and a first node;
a first p-type metal oxide semiconductor (PMOS) transistor connected between the power supply voltage and the boost node, and comprising a gate which receives a first clock signal;
a first switch which selectively connects the input voltage signal to the first node in response to the first clock signal and a second clock signal, the second clock signal being an inversion signal of the first clock signal;
a second switch which selectively connects a reference voltage signal to the first node in response to the second clock signal, a level of the reference voltage signal being lower than a maximum level of the input voltage signal;
a second PMOS transistor which transfers a boosting voltage to a second node in response to the second clock signal and which generates the sampling control signal, the boosting voltage being a voltage at the boost node; and
a third switch which resets the second node in response to the second clock signal.

5. The folding analog-to-digital converter of claim 4, wherein the bootstrapped clock generator further comprises:
a first input buffer which buffers the input voltage signal to provide the buffered input voltage signal to the first switch; and
a second input buffer which buffers the reference voltage signal to provide the buffered reference voltage signal to the second switch.

6. The folding analog-to-digital converter of claim 2, wherein the track-and-hold unit further comprises:
an input buffer which buffers the input voltage signal;
a MOS transistor which transfers an output signal of the input buffer to a third node in response to the generated sampling control signal;
a capacitor coupled to the third node; and
an output buffer which buffers a voltage of the third node to output the generated sampled signal.

7. The folding analog-to-digital converter of claim 2, wherein the track-and-hold unit further comprises:
a first MOS transistor which transfers the input voltage signal to a third node in response to the generated sampling control signal;
a second MOS transistor connected between the third node and a fourth node, the second MOS transistor comprising a first electrode and a second electrode electrically coupled to each other, and a gate which receives the clock signal; and
a capacitor coupled to the fourth node.

8. The folding analog-to-digital converter of claim 7, wherein the track-and-hold unit further comprises:
- an input buffer which buffers the input voltage signal to provide the buffered input voltage signal to the first MOS transistor; and
- an output buffer which buffers a voltage of the fourth node to output the generated sampled signal.

9. A folding analog-to-digital converter comprising:
- a reference voltage generator which generates a plurality of reference voltages;
- a first track-and-hold circuit which receives an input voltage signal, and which samples and holds the received input voltage signal in response to a sampling control signal to generate a sampled signal, a voltage level of the sampling control signal being lower than or equal to a level of a power supply voltage;
- a first pre-amplification circuit which amplifies each of voltage differences between the generated sampled signal and each of the generated plurality of reference voltages;
- a second track-and-hold circuit which samples output signals of the first pre-amplification circuit;
- a second pre-amplification circuit which amplifies output signals of the second track-and-hold circuit;
- a folding amplification circuit which amplifies output signals of the second pre-amplification circuit to generate a plurality of folding signals;
- a first comparison circuit which performs precise comparing operations on the generated plurality of folding signals;
- a second comparison circuit which performs approximate comparing operations on the output signals of the second pre-amplification circuit;
- a third comparison circuit which compares output signals of the first comparison circuit with output signals of the second comparison circuit; and
- an encoder which generates a digital output signal corresponding to the received input voltage signal based on output signals of the third comparison circuit.

10. The folding analog-to-digital converter of claim 9, wherein the first track-and-hold circuit generates the sampling control signal having the voltage level lower than or equal to the level of the power supply voltage by maintaining an initial level of a boost capacitor voltage at a level lower than the level of the power supply voltage, the boost capacitor voltage being a voltage charged across a boost capacitor comprised in the first track-and-hold circuit.

11. The folding analog-to-digital converter of claim 9, wherein the first track-and-hold circuit comprises:
- a bootstrapped clock generator which generates the sampling control signal based on a clock signal; and
- a track-and-hold unit which samples and holds the received input voltage signal in response to the generated sampling control signal to generate the sampled signal.

12. The folding analog-to-digital converter of claim 9, further comprising:
- a first preset switch coupled to output terminals of the first pre-amplification circuit;
- a second preset switch coupled to output terminals of the second pre-amplification circuit;
- a third preset switch coupled to output terminals of the folding amplification circuit; and
- a fourth preset switch coupled to output terminals of the first comparison circuit.

13. The folding analog-to-digital converter of claim 12, wherein the first preset switch, the second preset switch, the third preset switch, and the fourth preset switch are sequentially turned off in response to a clock signal that has multiple phases.

14. The folding analog-to-digital converter of claim 9, wherein the second track-and-hold circuit comprises:
- a first metal oxide semiconductor (MOS) transistor which transfers one of the output signals of the first pre-amplification circuit to a first node in response to a first clock signal;
- a second MOS transistor connected between the first node and a second node, and comprising a first electrode and a second electrode electrically coupled to each other, and a gate which receives a second clock signal, the second clock signal being an inversion signal of the first clock signal;
- a third MOS transistor which transfers another one of the output signals of the first pre-amplification circuit to a third node in response to the first clock signal;
- a fourth MOS transistor connected between the third node and a fourth node, and comprising a first electrode and a second electrode electrically coupled to each other, and a gate which receives the second clock signal;
- a first capacitor coupled to the second node; and
- a second capacitor coupled to the fourth node.

15. The folding analog-to-digital converter of claim 9, wherein the folding amplification circuit comprises a plurality of folding amplifiers.

16. The folding analog-to-digital converter of claim 15, wherein each of the plurality of folding amplifiers comprises:
- a plurality of differential input stages comprising a plurality of MOS transistors and a current source;
- a plurality of MOS transistors coupled to output nodes of the plurality of differential input stages; and
- a reset transistor which resets output nodes of the corresponding folding amplifier.

17. A track-and-hold circuit of a folding analog-to-digital converter, the track-and-hold circuit comprising:
- a bootstrapped clock generator which generates a sampling control signal based on a clock signal;
- a track-and-hold unit which receives an input voltage signal, and which samples and holds the received input voltage signal in response to the generated sampling control signal to generate a sampled signal,
- wherein a voltage level of the generated sampling control signal is lower than or equal to a level of a power supply voltage; and
- further comprising a boost capacitor, wherein the generated control signal has the voltage level lower than or equal to the level of the power supply voltage by maintaining an initial level of a boost capacitor voltage at a lower level than the level of the power supply voltage, the boost capacitor voltage being a voltage charged across the boost capacitor.

18. A track-and-hold circuit of a folding analog-to-digital converter, the track-and-hold circuit comprising:
- a bootstrapped clock generator which generates a sampling control signal based on a clock signal; and
- a track-and-hold unit which receives an input voltage signal, and which samples and holds the received input voltage signal in response to the generated sampling control signal to generate a sampled signal,
- wherein a voltage level of the generated sampling control signal is lower than or equal to a level of a power supply voltage, and
- wherein the bootstrapped clock generator comprises:
  - a boost capacitor connected between a boost node and a first node;

a first p-type metal oxide semiconductor (PMOS) transistor connected between the power supply voltage and the boost node, and comprising a gate which receives a first clock signal;

a first switch which selectively connects the input voltage signal to the first node in response to the first clock signal and a second clock signal, the second clock signal being an inversion signal of the first clock signal;

a second switch which selectively connects a reference voltage signal to the first node in response to the second clock signal, a level of the reference voltage signal being lower than a maximum level of the input voltage signal;

a second PMOS transistor which transfers a boosting voltage to a second node in response to the second clock signal and which generates the sampling control signal, the boosting voltage being a voltage at the boost node; and a third switch which resets the second node in response to the second clock signal.

19. The track-and-hold circuit of claim 18, wherein the track-and-hold unit comprises:

an input buffer which buffers the input voltage signal;

a MOS transistor which transfers an output signal of the input buffer to a third node in response to the generated sampling control signal;

a capacitor coupled to the third node; and an output buffer which buffers a voltage of the third node to output the generated sampled signal.

* * * * *